United States Patent [19]

Hoshino et al.

[11] Patent Number: 4,507,705
[45] Date of Patent: Mar. 26, 1985

[54] VIBRATION ANALYZING DEVICE

[75] Inventors: Shigeo Hoshino, Yokosuka; Kazuhiro Takenaka; Hideo Muro, both of Yokohama, all of Japan

[73] Assignee: Nissan Motor Company, Limited, Yokohama, Japan

[21] Appl. No.: 524,865

[22] Filed: Aug. 19, 1983

[30] Foreign Application Priority Data

Aug. 27, 1982 [JP] Japan ................................ 57-148874

[51] Int. Cl.³ .............................................. H01G 7/00
[52] U.S. Cl. ................................. 361/283; 73/DIG. 1
[58] Field of Search ............................... 361/280, 283; 73/DIG. 1

[56] References Cited

U.S. PATENT DOCUMENTS

| 2,576,489 | 11/1951 | Stovall | 361/280 |
| 2,866,141 | 12/1958 | Frank et al. | 361/283 |
| 4,317,611 | 5/1980 | Petersen | 350/6.6 |
| 4,420,790 | 12/1983 | Golke et al. | 361/283 |

FOREIGN PATENT DOCUMENTS 57-64978  4/1982  Japan .

*Primary Examiner*—Donald A. Griffin
*Attorney, Agent, or Firm*—Schwartz, Jeffery, Schwaab, Mack, Blumenthal & Koch

[57] ABSTRACT

A microelectronic device to detect mechanical vibrations and analyze vibration frequencies. The device comprises a vibrator in the form of thin plate supported on a semiconductor substrate in the manner of either cantilever beam or fixed beam. The vibrator is either conductive or coated with a conductive film to serve as a vibratable electrode layer. The substrate is formed with a fixed electrode layer in an area opposite to the vibrator, and an electric circuit to detect a change in the capacitance between the fixed and vibratable electrode layers is integrated with the substrate. For discrimination of vibration frequencies without using any bandpass filter, the device may have a plurality of vibrators different in resonance frequency each paired with a fixed electrode layer. To make the device sharply responsive to specific frequencies within a very narrow range, two vibrators slightly different in resonance frequency are arranged close to each other, and changes in the capacitances of two variable capacitors respectively provided by the two vibrators are detected combinedly.

28 Claims, 49 Drawing Figures

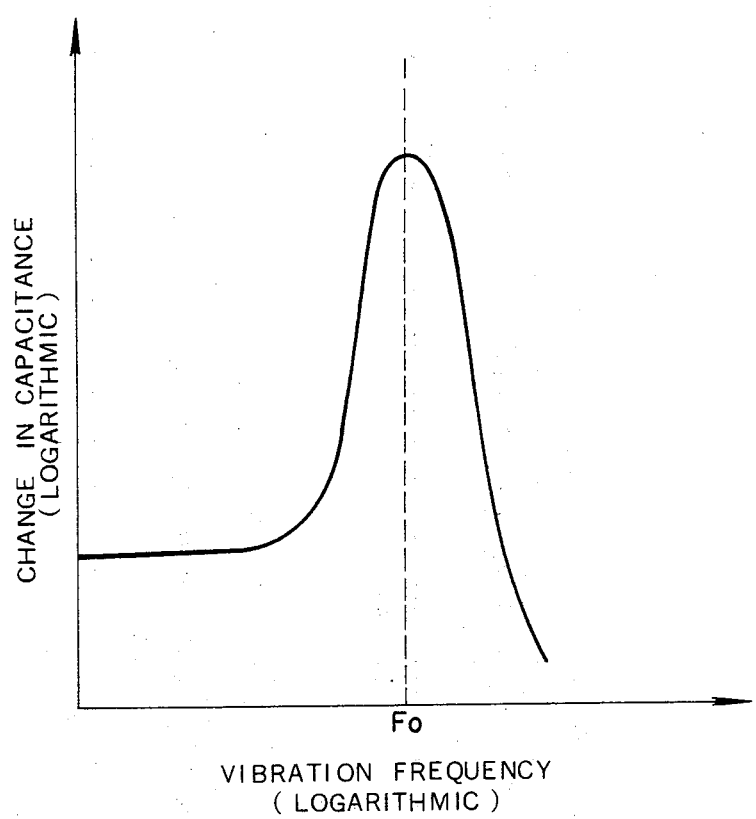

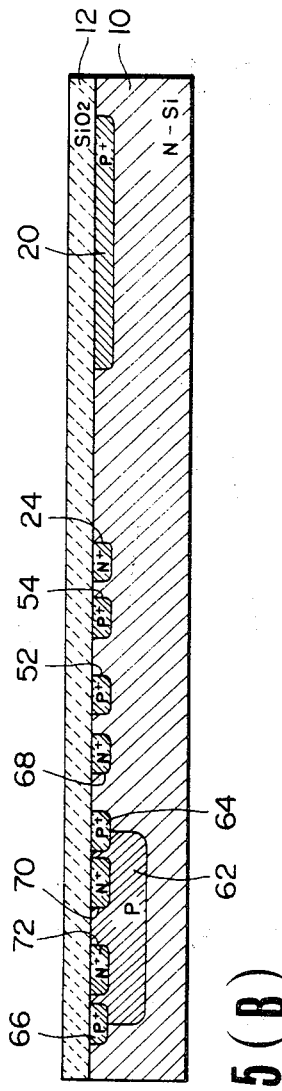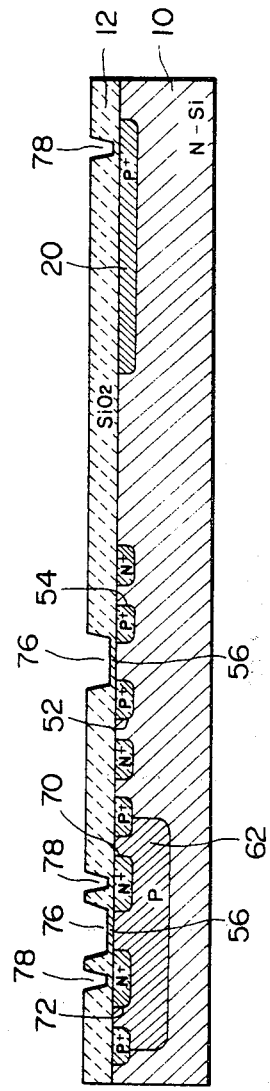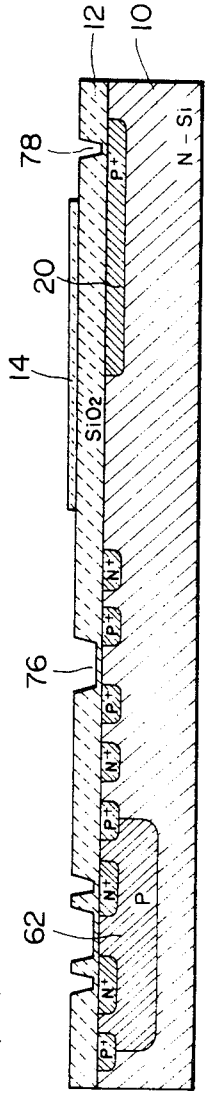

VIBRATION ANALYZING DEVICE

BACKGROUND OF THE INVENTION

This invention relates to a device to detect and analyze mechanical vibrations, and more particularly to a vibration analyzing device in which a vibration pickup part and an associated electric circuit are integrated in and upon a semiconductor substrate.

To detect mechanical vibrations for the purpose of extracting a specific frequency component or analyzing the vibration spectrum, it is customary to use a combination of a transducer which converts mechanical vibration into electrical signal and at least one band-pass filter for frequency discrimination of the signal produced by the transducer. Piezo-electric and some other types of transducers are available for this purpose, and in general such transducers are so devised as to possess a flat response characteristic over a relatively wide range of frequency.

In measuring mechanical vibrations by using a conventional instrument the transducer is attached to the object of measurement. Where the object of measurement is small in size and light in weight and particularly when it is intended to detect even minute vibrations of the small-sized object, the transducer is required to be very small in both size and mass. If this requirement is not met the attachment of the transducer results in a change in the vibration characteristics of the object of measurement, and therefore it becomes impossible to achieve accurate measurement of the vibrations. This manner applies also in the treatment of the lead wires extended from the transducer, so that the lead wires must be treated so as not to affect the vibrations of the object of measurement. Therefore, the conventional transducers are not always suitable for specific applications, for example for installation in a motor vehicle to analyze vibrations attributed to the operation of the engine.

In a vibration analyzer in which the electrical output of the transducer is transmitted to a band-pass filter or a plurality of band-pass filters via lead wires, the lead wires need to be made practically insusceptible to external noises since the output signal of the transducer is susceptible to noises especially when the signal is very weak. Therefore, the lead wires including some shield are liable to become considerably thick, and then undesirable influences of the lead wires on the vibration characteristics of the object of measurement will become serious in some cases. Where it is intended to perform minute analysis of the vibration spectrum, it is necessary to use a number of band-pass filters each of which is produced with very high precision. Naturally the circuit construction of the entire band-pass filters becomes very complicated with the need of using a large number of circuit elements. Then, besides an inevitable rise in the cost, the electric circuit including the band-pass filters occupies a considerable space and has considerable restrictions as to the placement thereof. Of course it is impracticable to mount the transducer and all the band-pass filters on a single circuit board which is suitable for attachment to the object of vibration measurement.

SUMMARY OF THE INVENTION

It is an object of the present invention to provide a novel vibration analyzing device, in which transducer means for converting mechanical vibration into electrical signal, frequency discrimination means and an associated electric circuit are all integrated in and upon a very small substrate so that the device as a whole is very small in size and very light in weight.

It is a further object of the invention to provide a vibration analyzing device of the above stated type, which has the ability of accurately discriminating very narrow ranges of frequency of the detected vibration without need of using any band-pass filter.

A vibration analyzing device according to the invention comprises a semiconductor substrate, a vibrator having a vibratable portion, which is generally in the form of thin plate and comprises a unitary electrode layer, and at least one base portion which is contiguous to the vibratable portion and fixed to the substrate such that the vibratable portion is spaced from the substrate and extends generally parallel to the substrate, a fixed electrode layer formed in a surface region of the substrate in an area opposite to the vibratable portion of the vibrator such that the electrode layer of the vibrator and the fixed electrode layer provide a variable capacitor, and an electric circuit means integrated with the substrate for detecting a change in the capacitance of the variable capacitor.

The vibrator may be formed of a conductive material such as silicon so that the entirety of its vibratable portion may serve as the unitary electrode layer, or may alternatively be formed of a nonconductive material such as silicon oxide with a conductive film coated on the vibratable portion. The vibrator is supported on the substrate in the manner of either cantilever beam or fixed beam.

For example, the electric circuit includes a fixed capacitor which is connected in series with the aforementioned variable capacitor such that a source voltage is divided by the two capacitors and a MOS transistor connected such that the voltage divided by the two capacitors is applied to the gate of the transistor. In this circuit the gate voltage of the MOS transistor changes correspondingly to a change in the capacitance of the variable capacitor attributed to a vibratory movement of the electrode layer of the vibrator and becomes maximal at the resonance frequency of the vibrator.

For the purpose of discriminating vibration frequencies, a device according to the invention may comprise a plurality of vibrators different in resonance frequency with the provision of a fixed electrode layer and a detection circuit for each vibrator.

The vibrator in the device of the invention can be formed by using a conventional thin-film technique. For example, initially a film is deposited on the substrate surface which is precedingly formed with a provisional support layer in a selected area, and subsequently the support layer is removed by etching to thereby provide a space between the substrate surface and the vibratable portion of the vibrator film.

In a device according to the invention, the vibrator(s) and the electric circuit(s) including the fixed electrode layer for each vibrator are all integrated in and upon a semiconductor substrate, so that this device can be made very small in size and light in weight and can easily be produced at low cost by utilizing conventional techniques for the manufacture of integrated semiconductor circuits. By using this device it is possible to accurately detect and analyze mechanical vibrations even when the object of measurement is very small in size and light in weight. Furthermore, discrimination of the vibration frequencies can be accomplished by using a single device having a suitable number of vibrators similar in form but different in resonance frequency without the need of using band-pass filters and many lead wires. Accordingly this device is applicable even to complicated mechanisms wherein severe restrictions are placed on the installation of a vibration analyzing system.

A device according to the invention can be made highly sensitive only to vibration frequencies within a very narrow range. In that case, the device has a vibration detector unit which comprises two vibrators slightly different in resonance frequency and arranged close to each other, two fixed electrode layers arranged opposite to the respective vibrators such that each pair of the electrode layer of the vibrator and the fixed electrode layer provide a variable capacitor and an electric circuit to detect changes in the capacitances of the two variable capacitors combinedly. The device may have a plurality of such detector units with differences in the mean value of the resonance frequencies of the two vibrators in one unit.

BRIEF DESCRIPTION OF THE DRAWINGS

FIG. 4 is a graph showing the frequency characteristic of the device of FIGS. 1 and 2;

FIGS. 5(A) to 5(I) illustrate a process of manufacturing the device of FIGS. 1 and 2;

DESCRIPTION OF THE PREFERRED EMBODIMENTS

Figure 1:
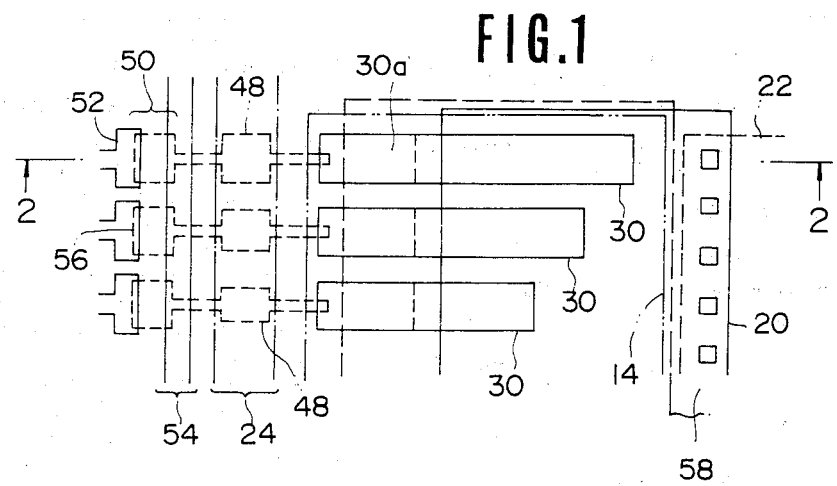
FIG. 1 is a schematic plan view of a vibration analyzing device as an embodiment of the invention.
Figure 2:
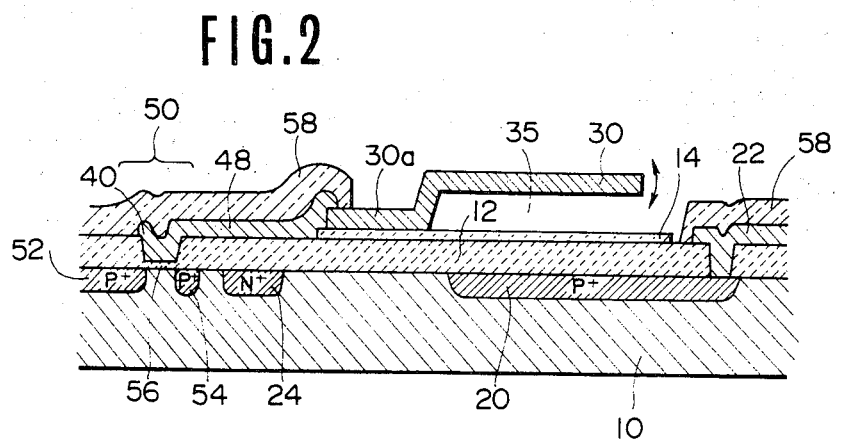
FIG. 2 is a schematic sectional view taken along the line 2—2 in FIG. 1.

FIGS. 1 and 2 show a principal part of a vibration analyzing device as the first embodiment of the invention. This device has a plurality of (three in the illustration) vibrators or reeds 30 which are individually mounted on a silicon substrate 10 in the manner of a cantilever beam. The three reeds 30 in FIG. 1 are different in length and, hence, in resonance frequency, but in other respects these reeds 30 can be regarded as identical. Therefore, the following description is given with respect to only one of the three reeds 30 in FIG. 1.

In this embodiment each reed 30 is formed of polycrystalline silicon, which is a preferred example of electrically conductive materials, and has the shape of a strip which is bent so as to become stairlike in longitudinal sections. The upper surface of the silicon substrate 10 is coated with a silicon dioxide film 12, and a selected area of the oxide film 12 is coated with an insulating film 14. A base portion 30a of the reed 30 adheres fixedly to the insulating film 14 such that the remaining portion of the reed 30 extends parallel to the upper surface of the substrate 10 with a gap 35 of a constant width therebetween. When subjected to external vibrations the reed 30 vibrates in the directions indicated by the arrow in FIG. 2 with its base portion 30a as the fulcrum. The amplitude of the vibration of the reed 30 becomes maximal at a resonance frequency that is determined by the material, thickness and effective length of the reed 30. Since the reed 30 is formed of silicon it can serve as a vibratable electrode. Accordingly the reed 30 in this embodiment will be referred to as movable electrode at some locations in the subsequent description.

In the silicon substrate 10 on the upper side, there is a diffused P+ layer 20 adjacent the oxide film 12 in a region opposite the vibratable portion of the reed or movable electrode 30. This diffused P+ layer 20 is used as a fixed electrode which is paried with the movable electrode 30 and, therefore, will alternatively be referred to as fixed electrode layer. The movable electrode 30 and the fixed electrode layer 20 constitute a capacitor, and when the movable electrode 30 vibrates the capacitance of this capacitor varies according to the manner of vibration of the electrode 30 since the distance between the movable and fixed electrodes 30 and 20 varies.

Figure 3:
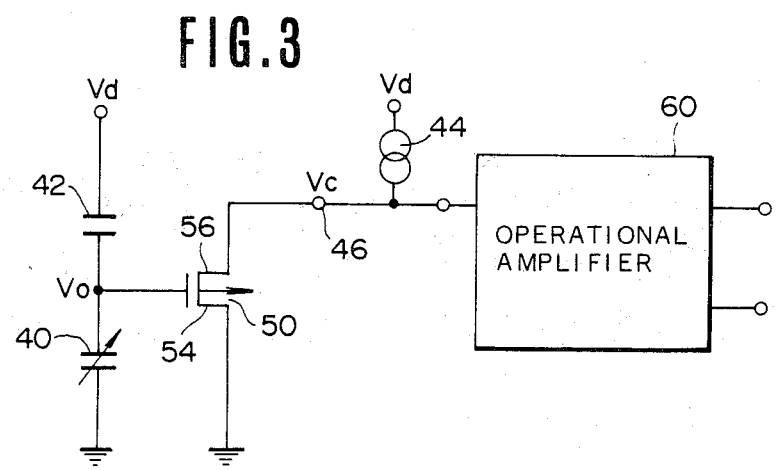
FIG. 3 is a diagram of an electric circuit equivalent to the device of FIGS. 1 and 2.

From an electric point of view, the device of FIGS. 1 and 2 is represented by an equivalent circuit of FIG. 3, wherein variable capacitor 40 corresponds to the capacitor provided by the two electrodes 20 and 30. The variable capacitor 40 and a fixed capacitor 42 are connected in series with each other and with a DC power source, so that a voltage $V_0$ produced by dividing the source voltage $V_d$ appears at the junction point between the two capacitors 40 and 42. A constant current source 44 and a MOS transistor 50 constitute a source-follower circuit, and the aforementioned voltage $V_0$ is applied to the gate of the MOS transistor 50. Accordingly a voltage $V_c$ in dependence on the gate voltage $V_0$ develops at the output terminal 46 of the source-follower circuit, and this output voltage $V_c$ is put into an operational amplifier circuit 60 which provides an output to an external instrument (not shown).

The resonance characteristic of the reed 30 in FIGS. 1 and 2 is determined by the density ρ, Young's modulus E, thickness t and effective length L of the reed 30. When a suitable material is selected, a desired resonance characteristic can be obtained by appropriately determining the thickness t and length L of the reed 30. That is, the resonance frequency $f_R$ of the reed 30 is given by the following equation:

$$f_R = \frac{3.52}{2\pi}\sqrt{\frac{Et^2}{12\rho L^4}}$$

When the reed 30 vibrates the amount of a change in the capacitance of the capacitor 40 in FIG. 3 depends on the amplitude of vibration of the reed 30, and the voltage $V_0$ at the junction point between the variable and fixed capacitors 40 and 42 changes with the change in the capacitance. The change in the voltage $V_0$ is detected by the MOS transistor 50 and appears at the output terminal 46. Therefore, the manner of the change in the output voltage $V_c$ at the terminal 46 almost conforms with the vibration characteristic of the reed 30.

FIG. 4 shows the relationship between a driving frequency applied to the vibration analyzing device of FIGS. 1 and 2 and a change in the output voltage $V_c$ at the output terminal 46 in FIG. 3, which is proportional to a change in the capacitance of the variable capacitor 40 insofar as the amount of the change is so small that linear approximation is permissible. In FIG. 4 the frequency $F_0$ corresponds to the reasonance frequency of the reed 30. When the driving frequency is $F_0$ the amplitude of vibration of the reed 30 becomes maximal and, hence, both the amount of the change in the capacitance of the variable capacitor 40 and the amount of the change in the output voltage $V_c$ at the terminal 46 become maximal. Since the reed 30 is in the form of a cantilever beam, the reed 30 makes a nearly constant response to vibration frequencies below the resonance frequency $F_0$ but scarcely responds to vibration frequencies above the resonance frequency $F_0$. A change in the output voltage $V_c$ at the terminal 46 accurately reflects such a resonance characteristic of the reed 30.

The electric circuit shown in FIG. 3 for the detection of a change in the capacitance is also formed in the substrate 10 in the following manner.

In the device of FIGS. 1 and 2 an aluminum electrode 22 joins to the fixed electrode layer 20 of the capacitor, and another aluminum electrode 48 joins to the movable electrode 30 and serves also as a gate electrode for the MOS transistor 50. In the silicon substrate 10 on its upper side, there is a diffused N+ layer 24 adjacent the oxide film 12 in a region opposite to the aluminum electrode 48 so that the diffused N+ layer 24 and a portion of the aluminum electrode 48 provide the aforementioned fixed capacitor 42. At short distances from the diffused N+ layer 24 and adjacent the oxide film 12, a diffused P+ layer 52 and another diffused P+ layer 54 are formed in the substrate 10 so as to serve as the source region nd drain region of the aforementioned MOS transistor 50, respectively. An extended portion of the aluminum electrode 48 intrudes into the oxide film 12 in the region between the two diffused P+ layer 52 and 54 so as to provide a gate electrode 40 to the MOS transistor 50 and to leave a very thin gate oxide film 56 between the gate electrode 40 and the upper surface of the substrate 10.

The aluminum electrodes 22 and 48 and the uncoated areas of the upper surface of oxide film 12 are closely covered with a protective film 58 which is, for example, formed of phosphorus-containing silica glass (will be referred to as PSG) grown from vapor phase.

The constant current source 44 in FIG. 3 is also integrated in the silicon substrate 10 (though not illustrated in FIGS. 1 and 2) in association with the source region 52 of the MOS transistor 50. Also it is possible and preferable to form the operational amplifier circuit 60 in FIG. 3 within or upon the substrate 10 as either a CMOS transistor or an NMOS transistor, and such integration of the operational amplifier circuit 60 can easily be accomplished as will be described hereinafter. However, the integration of the operational amplifier circuit 60 within or upon the substrate 10 is not an indispensable requisite to a device of the invention.

Next, an exemplary process of producing the device of FIGS. 1 and 2, with integration of a CMOS transistor to serve as the operational amplifier 60, will be described with reference to FIGS. 5(A) to 5(I).

First, as shown in FIG. 5(A), a P-type well 62, five diffused P+ layers 20, 52, 54, 64, 66 and four diffused N+ layers 24, 68, 70, 72 are formed in an N-type silicon substrate 10 by known techniques. As mentioned hereinbefore, the diffused P+ layer 20 becomes the fixed electrode layer of the variable capacitor 40 and the diffused N+ layer 24 becomes one electrode of the fixed capacitor 42, and the two diffused P+ layer 52 and 54 become the source and drain regions of the MOS transistor 50, respectively. In the P-type well 62 an NMOS transistor is formed at the subsequent steps, and the diffused P+ layers 64 and 66 in this region become a channel stopper. Then a silicon dioxide film 12 of a uniform thickness (e.g. about 1 μm) is formed on the upper surface of the substrate 10.

Next, as shown in FIG. 5(B), the oxide film 12 is locally removed in two gate regions 76 and three contact regions 78 by a known photoetching method, and a thin gate oxide film 56 is formed in each of the gate regions 76 and contact regions 78 by thermal oxidation which is performed, for example, at 1050° C. for 90 min.

Referring to FIG. 5(C), an insulating film 14 is formed on the surface of the oxide film 12 in a region where the reed 30 will be formed so as to extend parallel to the diffused P+ layer 20. For example, the insulating film 14 is formed by first depositing $Si_3N_4$ on the oxide film 12 to a thickness of 4000–5000 Å over an almost entire area by a vapor phase growth method and then removing the unnecessary areas of the silicon nitride film by a conventional photoetching method.

Figure 5D:
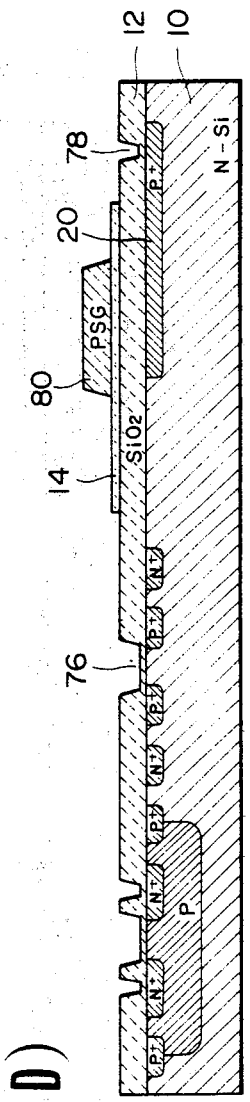

Next, referring to FIG. 5(D), PSG is deposited on the insulating film 14 by a known method such as a vapor phase growth method so as to form a uniform layer having a thickness of, for example, 3–5 μm, and then the PSG layer is partly removed by a photoetching method so as to leave an island 80 of PSG in a selected area above the diffused P+ layer 20. For convenience, this PSG island 80 will be called spacer. At the etching treatment, the insulating film 14 protects the underlying oxide film 12.

Figure 5E:
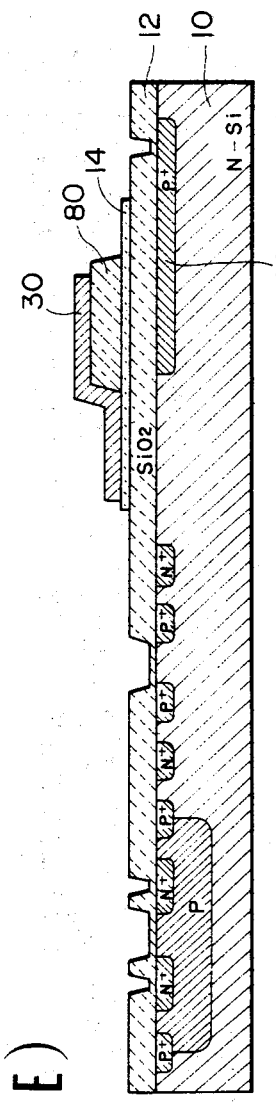

Then, as shown in FIG. 5(E), the reed 30 having a stair-like sectional shape is formed by the following steps. First polycrystalline silicon is deposited by a vapor phase growth method over an almost entire area of the insulating film 14 including the spacer 80 deposited thereon. Next the deposited polycrystalline silicon is doped with a desired dopant by a known method such as an ion implantation method. Finally the unnecessary areas of the polycrystalline silicon layer is removed by a known photoetching method so as to leave the stair-like coating 30 shown in FIG. 5(E).

Figure 5F:
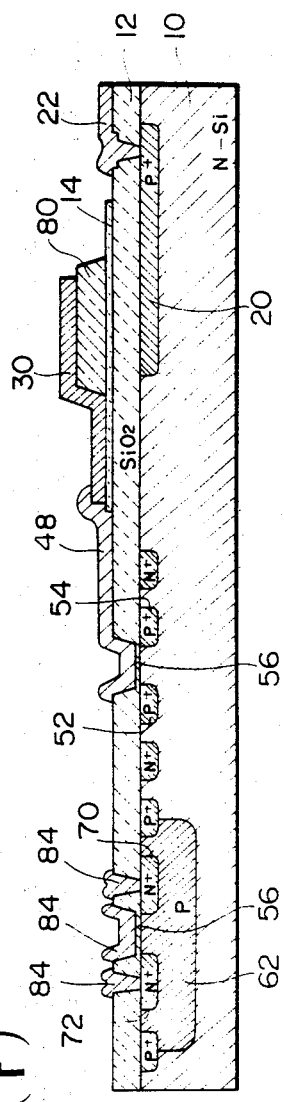

Referring to FIG. 5(F), the oxide films 56 in the contact regions 78 are removed by a photoetching method, and thereafter the interconnection electrodes 22 and 48 and electrodes 84 for a CMOS transistor are formed by first depositing a suitable conductive metal such as aluminum or gold by an evaporation method over an almost entire area of the oxide film 12, then removing the unnecessary areas of the deposited metal film and finally annealing the treated substrate in nitrogen gas.

Figure 5G:
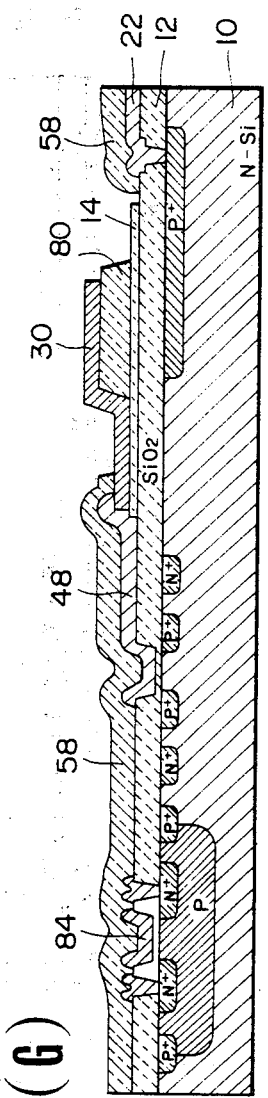

Referring to FIG. 5(G), the protective layer 58 is formed so as to leave the unfinished reed 30 and the surrounding area uncovered by first depositing PSG over the entire area by a known method such as vapor phase growth method and removing the unnecessary areas of the deposited PSG layer by photoetching. Though not illustrated, the protective layer is absent also in pad areas for extension of the electrodes.

Figure 5H:
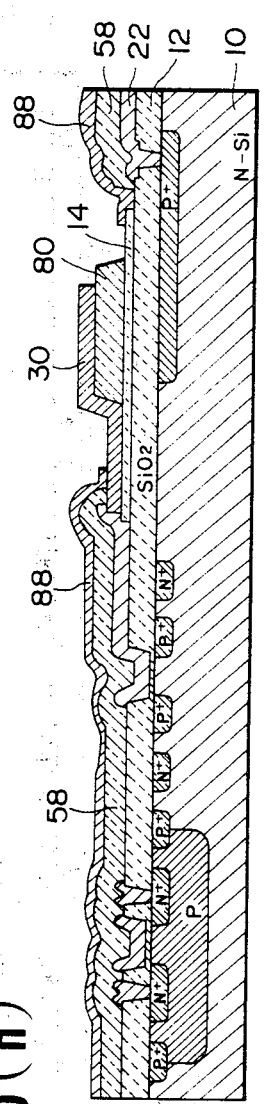

Referring to FIG. 5(H), preparatory to the subsequent etching treatment, a film 88 of a material resistant to hydrofluoric acid such as a silicon film is formed to a thickness of, for example, 1000-2000 Å over the entire area of the unfinished device and then locally removed by photoetching so as to leave the unfinished reed 30 and the spacer 80 uncovered.

Figure 5I:
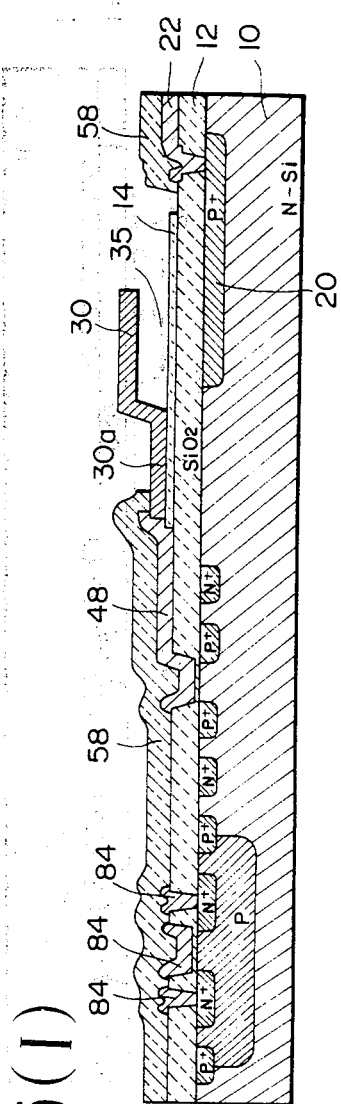

Next, as shown in FIG. 5(I), the PSG spacer 80 is completely removed by etching using a hydrofluorice acid base etching liquid. After that the silicon film 88 shown in FIG. 5(H) is removed by a suitable method such as a known dry etching method using $CF_4$ gas as the final step of the process of producing a vibration analyzing device according to the invention.

By the above described production method, the reed 30 can be formed at a relatively low temperature such as about 700° C. subsequent to the formation of the P-type well, diffused P+ layers and diffused N+ layers in the substrate 10, and accordingly it is possible to arbitrarily construct even relatively complicated circuits such as CMOS circuits in the substrate 10. Of course it is also possible to use P-type silicon as the material of the substrate 10 and construct NMOS circuits in the substrate.

As a modification of the above described embodiment, it is possible to use polycrystalline silicon employed as the material of the reed 30 also as the material of the gate electrode of the MOS transistor 50 to thereby construct the reed 30 and a polycrystalline silicon gate MOS transistor together.

The material of the reed 30 which itself serves as a movable electrode is not limited to polycrystalline silicon used in the above embodiment. For example, it is possible to alternatively use a metal that is resistant to hydrofluoric acid such as gold or platinum.

In producing a plurality of reeds 30 different in resonance frequency on a single substrate, the most convenient way is to make the lengths of the respective reeds different. In that case an intended number of reeds 30 different in resonance frequency can easily be formed on the substrate 10 without need of substantially modifying the process described with reference to FIGS. 5(A) to 5(I).

Where it is required that the resonance frequency of the polycrystalline silicon reed 30 in the above described embodiment be 10 KHz, for example, the requirement can be met by making the vibratable portion of the reed 30 270 μm in length, 0.5 μm in thickness and about 100 μm in width. The width of the reed 30 can arbitrarily be determined since the resonance frequency of the reed does not depend on the width. This device has the ability to perform vibration spectrum analysis as described hereinbefore, and such a high performance device can easily be produced at low costs by a familiar process of the above described type for the manufacture of semiconductor devices. The device of the invention can be produced in a very small size even when it has a number of reeds 30. For example, even when ten reeds 30 different in resonance frequency such that the device can discriminate vibration frequencies ranging from 10 KHz to 20 KHz with the accuracy of 1 KHz are all integrated on the single substrate 10 together with a capacitance detection circuit for each of the ten reeds 30, it is possible to produce a practical device which is only about 5 mm×5 mm in the widths of the substrate 10.

Figure 6:
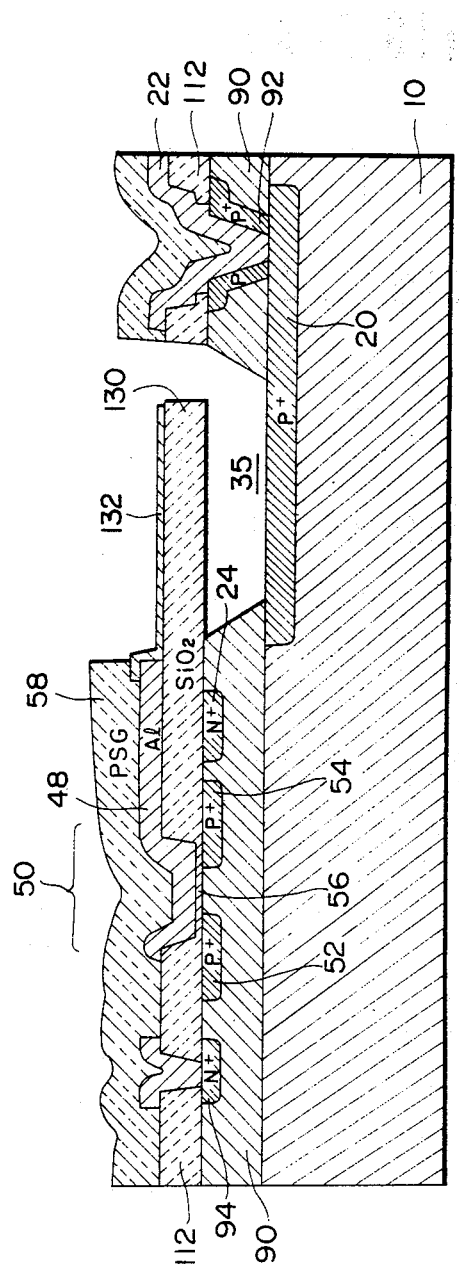
FIG. 6 is a schematic sectional view of a vibration analyzing device as the second embodiment of the invention.

FIG. 6 shows the second embodiment of the invention. The primary difference of the device of FIG. 6 from the device of FIG. 2 is that a vibrator or reed 130 in FIG. 6 is formed of an insulating material such as silicon dioxide with the provision of a conductive film 132 deposited on the surface of the nonconductive reed 130. The conductive film 132, which may be a gold film for example, serves as a movable electrode which is paired with the fixed electrode layer 20 in the substrate 10 to constitute the variable capacitor 40 in FIG. 3. Accordingly the aluminum electrode 48 described with respect to the first embodiment is so formed as to join to the electrode film 132. In other respects, the device of FIG. 6 is similar to the device of FIG. 2 in both construction and function. However, the device of FIG. 6 is produced by a considerably different process, which will be described with reference to FIGS. 7(A) to 7(I).

Figure 7A:
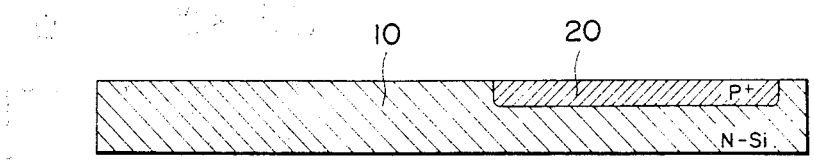
FIGS. 7(A) to 7(I) illustrate a process of manufacturing the device of FIG. 6.

Referring to FIG. 7(A), in this case the substrate 10 is a plate of N-type silicon with the (100) crystal face as its major surface by reason of the use of an anisotropic etching liquid at a subsequent step. First, a P+ layer 20 doped with boron in a concentration above $10^{20}$ cm$^{-3}$ is formed by a known method such as ion implantation. This P+ layer 20 becomes the fixed electrode of the variable capacitor 40 in FIG. 3 and, besides, serves as a stopper in the subsequent anisotropic etching process. (It is well known that a P+ layer high in the concentration of boron is effective as a stopper in anisotropic etching of silicon).

Figure 7B:
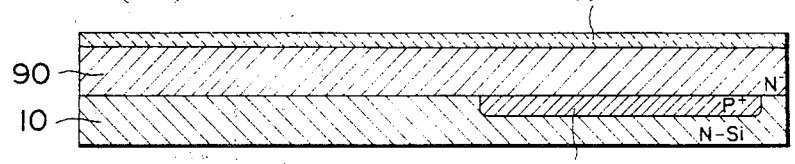

Next, as shown in FIG. 7(B), an N-type silicon layer 90 is epitaxially grown to a suitable thickness, e.g. 5 μm, over the entire area of the substrate 10 by a known method such as thermal decomposition of monosilane. Then, the surface of this silicon layer 90 is oxidized over the entire area by a known method such as wet oxidation at 1100° C. for 80 min so as to form an oxide film 112.

Figure 7C:
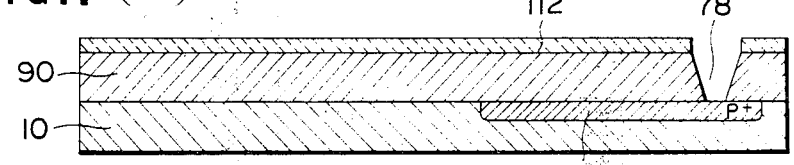

Referring to FIG. 7(C), the oxide film 112 in a contact region 178 is removed by a photoetching method, and then the epitaxial N-type silicon layer 90 in the same region is etched to thereby expose the surface of the P+ layer 20.

Figure 7D:
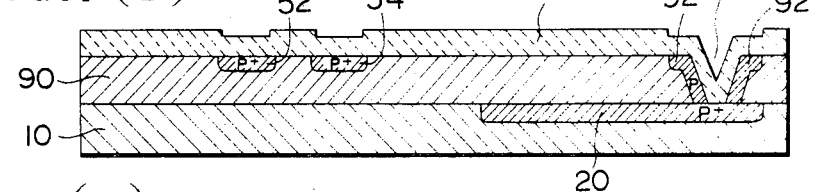

Referring to FIG. 7(D), the oxide film 112 is partly removed by a photoetching method in selected regions, and then diffused P+ layers 52, 54 to become the source and drain regions of a MOS transistor and another diffused P+ layer 92 in the contact region 178 are formed in the N-type silicon layer 90 by a known method such as a liquid diffusion method using boron tribromide as the diffusion source.

Figure 7E:
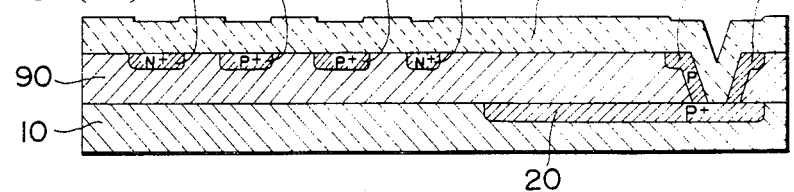

Next, as shown in FIG. 7(E), the oxide film 112 is partly removed by photoetching in selected regions, and then a diffused N+ layer 24 to become one electrode of the fixed capacitor 42 in FIG. 3 and another diffused N+ layer 94 to serve as a channel stopper in combination with the diffused N+ layer 24 are formed in the N-type silicon layer 90 by a known method such as a liquid diffusion method using phosphoryl trichloride as the diffusion source.

Figure 7F:
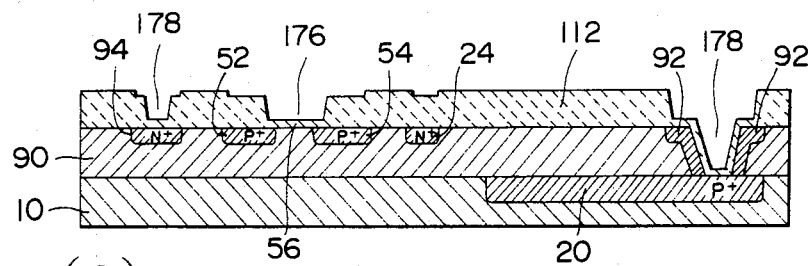

Referring to FIG. 7(F), the oxide film 112 is removed in a gate region 176 and contact regions 178 by a photoetching method, and then a gate oxide film 56 is formed by a known oxidation method such as thermal oxidation in oxygen gas at 1050° C. for 90 min. After that the oxide film remaining in the contact regions 178 is removed by photoetching.

Figure 7G:
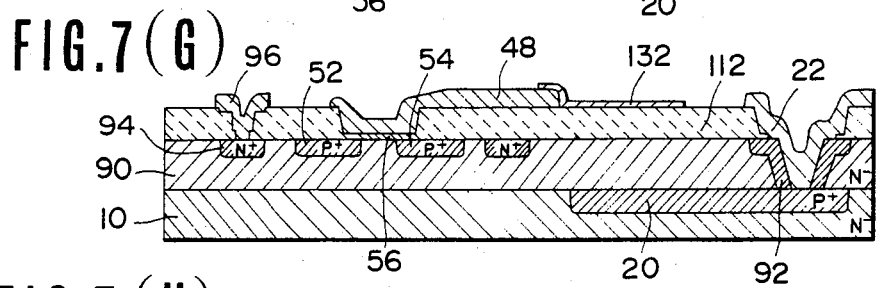

Referring to FIG. 7(G), interconnection electrodes 22, 48 and 96 are formed by first depositing a suitable metal such as aluminum or gold over the entire area by an evaporation method and then removing the unnecessary portions of the deposited metal film by a photoetching method. After that, a metal film 132 such as of gold, platinum or aluminum is formed on the oxide film 112 in a region to be used as the reed 130 in FIG. 6 by a known method such as a lift-off method.

Figure 7H:
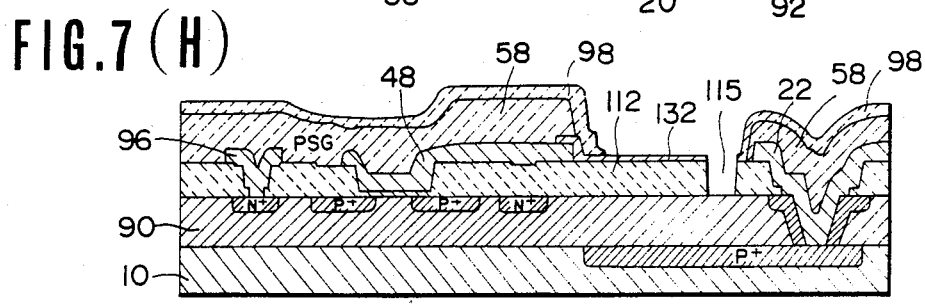

Referring to FIG. 7(H), the protective layer 58 is formed by first forming a PSG layer over the entire area by a vapor phase growth method and then removing the PSG layer in the region to form the reed 130 and selected other regions (not shown) for extension of the electrodes by a photoetching method. Next, a film 98 resistant to an anisotropic etching liquid such as a trisilicon tetranitride film is formed over the entire area, and the film 98 in the region to form the reed 132 is removed by photoetching. After that, the oxide film 112 in the region between the electrode 22 and the metal film 132 is removed by using the film 98 and the metal film 132 as a mask so as to provide a groove 115 in which the surface of the N-type silicon layer 90 is exposed.

Figure 7I:
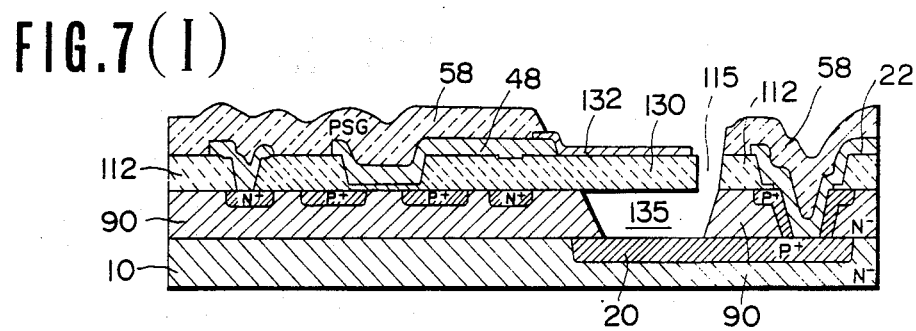
Figure 8:
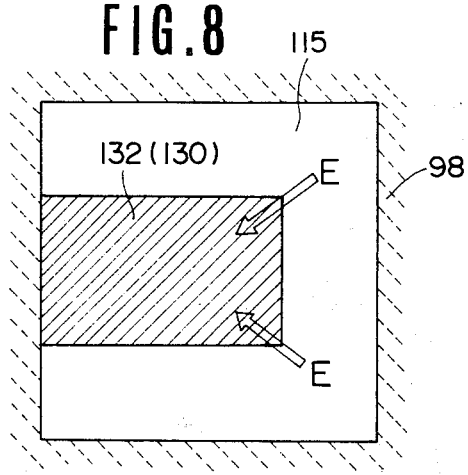
FIG. 8 is a fragmentary plan view of an unfinished device under processing in the process of FIGS. 7(A) to 7(I)

Referring to FIG. 7(I), utilizing the groove 115 the N-type silicon layer 90 in the region beneath the metal film 132 is etched with an anisotropic etching liquid such as a mixed liquid of ethylenediamine, pyrocatechol and water in the proportion of 18:7:3. In this etching process the P+ layer 20 of high boron concentration serves as a stopper against etching in the depth direction. In the direction along the (111) face of monocrystalline silicon the rate of etching by the anisotropic etching liquid is very low compared with the etch rates in the other directions. Therefore, when the N-type silicon layer 90 is etched from the surface defining the bottom of the groove 115, the N-type silicon 90 existing beneath the metal film 132 and the oxide film 112 undergoes lateral etching in the directions indicated by arrows E in the enlarged plan view of FIG. 8. Consequently the N-type silicon layer 90 in this region is greatly scooped out to provide a gap 135 contiguous to the groove 115, so that the intended portion of the oxide film 112 becomes a vibrator or reed 130 in the form of cantilever beam. At the same time the metal film 132 adhering to the reed 130 becomes a movable electrode. After that the trisilicon tetranitride film 98 used as a mask in the anisotropic etching procedure is removed by a known method such as a dry etching method using carbon tetrafluoride gas to complete the process of producing the device of FIG. 6.

Also in the above described second embodiment, it is easy to form a plurality of reeds 130 each coated with the electrode film 132 on the single substrate with difference in the lengths of the respective reeds 130. Alternative to gold in the above described exemplary process, the material of the electrode film 132 may be platinum or a still different metal that is resistant to an anisotropic etching liquid. Optionally the electrode film 132 may be covered with a protective film similar to the protective film 58.

Figure 9:
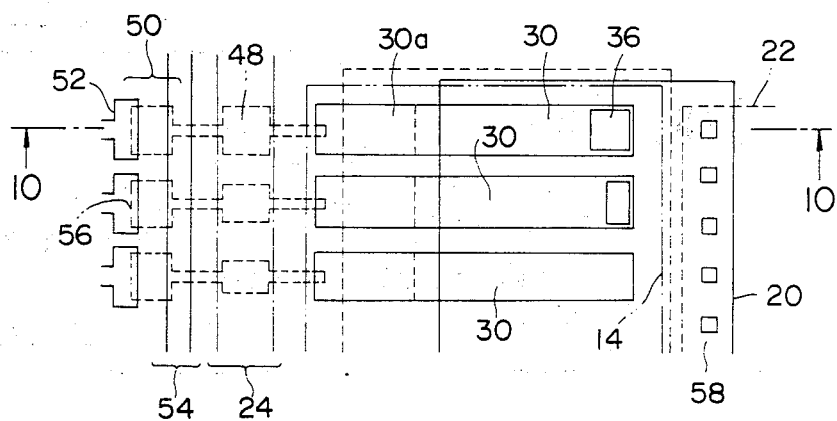
FIG. 9 is a schematic plan view of a vibration analyzing device as the third embodiment of the invention.
Figure 10:
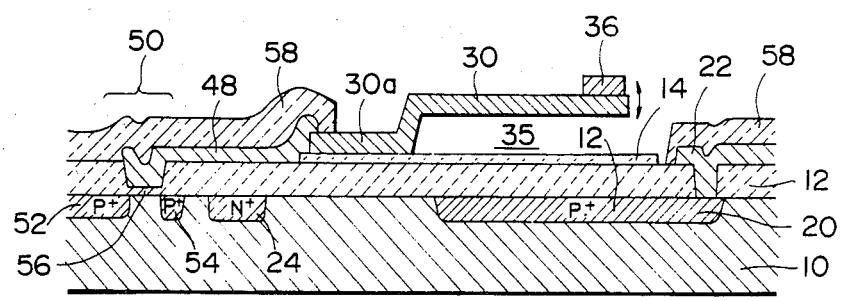
FIG. 10 is a schematic sectional view taken along the line 10—10 in FIG. 9.

FIGS. 9 and 10 show the third embodiment of the invention, which is a modification of the device of FIGS. 1 and 2 in one point. That is, in the device of FIGS. 9 and 10 each of the plurality of vibrators 30 of the cantilever beam type except the bottom one in FIG. 9 is provided with a weight 36 in its free end portion, and the weight 36 of the respective vibrators 30 are different in mass. The material of these weights 36 is not particularly limited. For example, these weights 36 may be formed of a metal such as gold or platinum, an insulating material such as silicon dioxide or trisilicon tetranitride or a semiconductor such as amorphous silicon.

By attaching the weights 36 different in mass to the respective vibrators 30 having the same thickness and the same length, it is possible to make these vibrators 30 different in resonance frequency $f_R$ as defined by the following equation.

$$f_R = \frac{1}{2\pi}\sqrt{\frac{3EI}{L^3(M + 0.23m)}}$$

where E is Young's modulus of the vibrator 30, I is the moment of inertia of the vibrator 30, M is the mass of the weight 36, and m is the mass of the vibrator 30. Since the resonance frequency of each vibrator 30 can be adjusted by controlling the mass of the weight 36, all the vibrators 30 in the device can be formed with the same length and that length can be made relatively short. Accordingly the use of the weights 36 is favorable for miniaturization of the device. The attachment of the weight 36 illustrated in FIGS. 9 and 10 is applicable also to the device of FIG. 6 and the devices described hereinafter as further embodiments of the invention.

Figure 11:
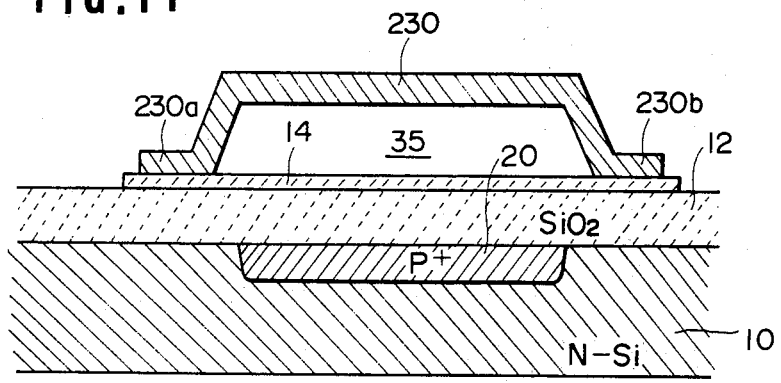
FIGS. 11 and 12 show the fourth and fifth embodiments of the invention in fragmentary and schematic sectional views, respectively.

As the fourth embodiment of the invention, FIG. 11 shows a modification of the device of FIGS. 1 and 2 in the configuration of the vibrator 30. That is, in the device of FIG. 11 each vibrator 230 is in the form of a fixed beam. More particularly, this vibrator 230 is a strip of a conductive material bent so as to have a generally dish-like shape in longitudinal sections and adheres to the insulating film 14 laid on the substrate surface in its two end portions 230a and 230b. The major vibratable portion of the vibrator 230 lies above the fixed electrode layer 20 in the substrate 10 and parallel to the substrate surface so as to provide a gap 35 of a suitable width between the vibrator 230 and the insulating film 14.

Figure 12:
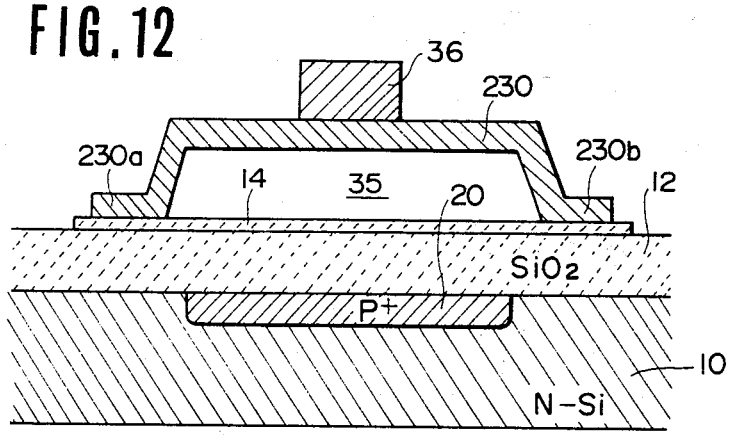

As the fifth embodiment, FIG. 12 shows the attachment of a weight 36 to the vibratable portion of the vibrator 230 of FIG. 11 for the purpose of adjusting the resonance frequency for the vibrator 230 without varying the effective length of the vibrator 230.

Figure 13:
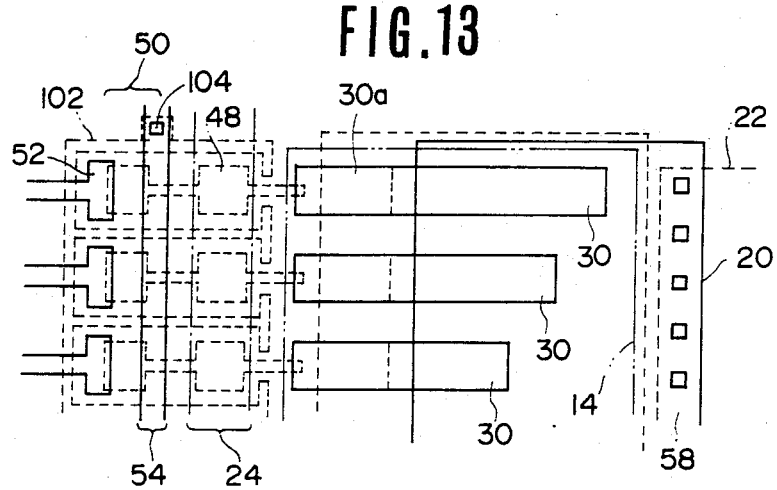
FIG. 13 is a schematic plan view of a vibration analyzing device as the sixth embodiment of the invention.

As the sixth embodiment, FIG. 13 shows a different modification of the device of FIGS. 1 and 2. A new feature of the device of FIG. 13 resides in that an additional electrode 102 is formed so as to surround a selected area in which the MOS transistors 50 and the fixed capacitors each provided by the electrode 48 and the diffused N+ layer 24 in the substrate 10 are located and that the electrode 102 is connected to the earth line at a contact point 104 which is provided by a hole in the substrate surface. This electrode 102 serves the purpose of preventing any leak current possibly flowing along the surface of the oxide film 12, e.g. a leak current from the power supply line (not shown), from arriving at the electrode 48. The additional electrode 102 can be formed of the same material (e.g. aluminum) as the electrode 48 without significantly complicating the manufacturing process. The modification shown in FIG. 13 is applicable to all the embodiments including the ones described hereinafter.

Figure 14A:
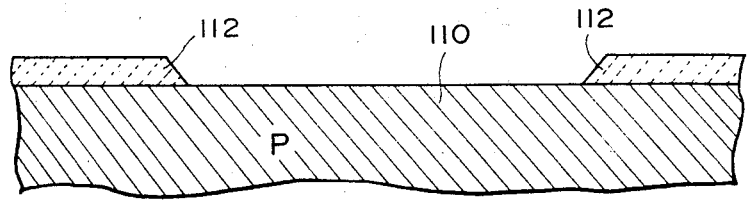
FIGS. 14(A) to 14(G) illustrate a process of manufacturing a vibration analyzing device as the seventh embodiment of the invention.
Figure 14B:
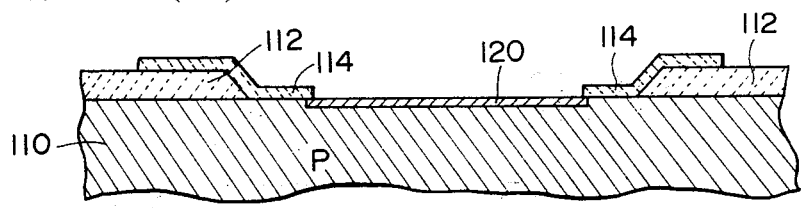
Figure 14C:
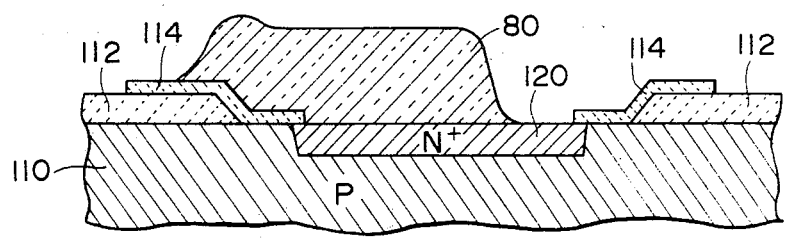
Figure 14D:
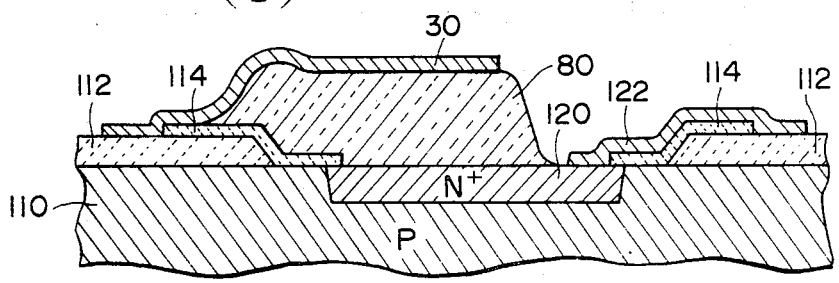
Figure 14E:
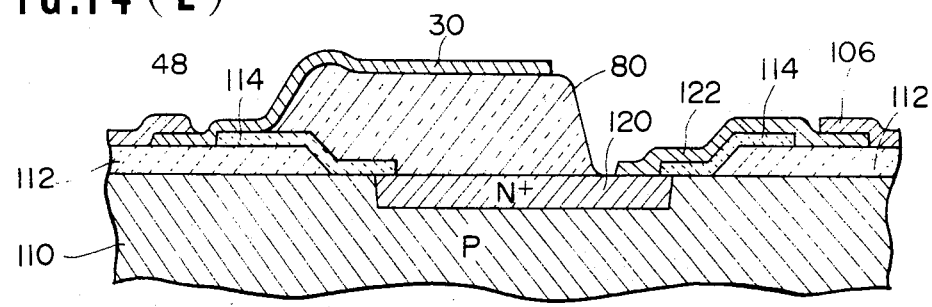
Figure 14F:
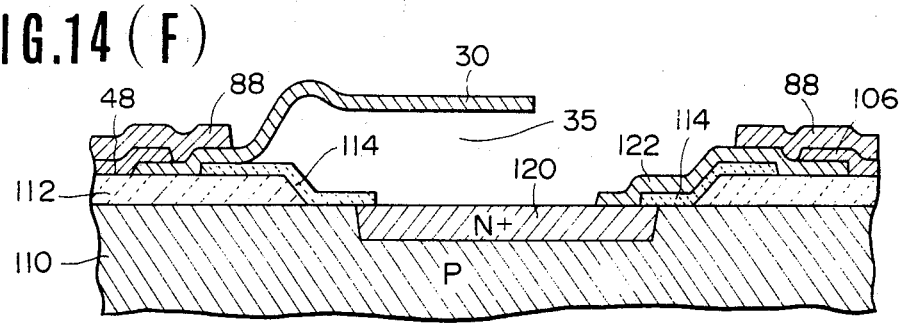
Figure 14G:
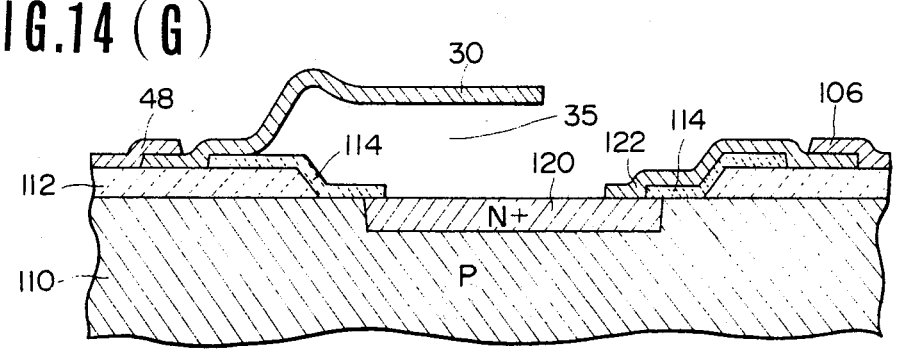

FIG. 14(G) shows a variable capacitor part of a device as the seventh embodiment of the invention. This device is similar in principle to the device of FIGS. 1 and 2 but utilizes a P-type silicon substrate 110 and therefore differs in some points of the construction. An exemplary process of producing this device will be described with reference to FIGS. 14(A) to 14(G).

Referring to FIG. 14(A), use is made of a P-type silicon substrate 110 having a resistivity of 5-8 ohm-cm for example, and the surface of the substrate 110 is subjected to thermal oxidation so as to form a thin $SiO_2$ layer 112 having a thickness of, for example, about 10000 Å over the entire surface area. Then the $SiO_2$ layer 112 is removed by photoetching in a selected region where the fixed electrode layer of the variable capacitor 40 in FIG. 3 is to be formed.

Referring to FIG. 14(B), $Si_3N_4$ is deposited on the substrate 110 in the state of FIG. 14(A) so as to form an insulating film 114 having a thickness of about 3000 Å over the entire surface area by, for example, a reduced-pressure CVD method in which $SiH_2Cl_2$ is caused to react with $NH_3$ at about 750° C., and the $Si_3N_4$ film 114 is removed by photoetching in the aforementioned region. Then a thin N+ layer 120 is formed in that region of the substrate 110 by introducing phosphorus into the substrate 110 by an ion inplantation method. This N+ layer 120 is used as the fixed electrode layer of the variable capacitor.

Next, as shown in FIG. 14(C), an island 80 of PSG is formed so as to serve as a spacer in subsequently forming the vibrator of the cantilever beam type. For example, use is made of a CVD method in which $SiH_4$ is oxidized at a relatively low temperature such as about 450° C. while P is introduced into the reaction system to thereby deposit PSG to a thickness of about 3-5 μm, and then the unnecessary portions of the PSG layer is removed by photoetching so as to leave the spacer 80 in the desired region. After that a heat treatment is made at about 1100° C., for example, for the purpose of rendering the edges of the PSG island 80 gentle and at the same time increasing the thickness of the thin N+ layer 120 to about 1 μm or greater.

Next, as shown in FIG. 14(D), the polycrystalline silicon vibrator 30 is formed so as to adhere to the PSG spacer in its major portion and to the $SiO_2$ layer 112 and the insulating film 114 in its base end portion, and at the same time a polycrystalline silicon electrode layer 122 is formed so as to extend to the N+ layer 120 along the surface of the insulating film 114. At first a polycrystalline silicon film is formed to a thickness of, for example, 0.5-1 μm over the entire surface area by a known method such as a reduced-pressure CVC method in which $SiH_4$ is thermally decomposed at about 620° C., and then P is introduced into the polycrystalline silicon film by, for example, an impurity element diffusion method in which diffusion is performed at about 950° by using $POCl_3$ as the diffusion source. After that the polycrystalline silicon film is selectively removed by photoetching so as to leave only the vibrator 30 and the interconnection electrode layer 122.

Referring to FIG. 14(E), an interconnecton electrode 48 which extends to the base end portion of the vibrator 30 and another interconnection electrode layer 106 which joins to the aforementioned electrode layer 122 are formed by first depositing aluminum over the entire surface area and then removing the unnecessary areas of the deposited aluminum film.

Next, as shown in FIG. 14(F), the PSG spacer 80 is completely removed so as to provide a gap 35 between the major portion of the vibrator 30 and the substrate surface. As a preparatory step, the entire surface area of the intermediate in the state of FIG. 14(E) is coated with a film 88 that is resistant to hydrofluoric acid, such as a silicon film having a thickness of $10^2$ to $10^3$ angstroms, and the film 88 in the region selected for etching of the PSG spacer 80 is removed. After that the PSG spacer 80 is completely etched by using a hydrofluoric acid. Upon completion of the etching, the vibrator 30 assumes the intended form of a cantilever beam.

The process of producing the device shown in FIG. 14(G) is completed by removing the silicon film 88 used as the mask in the etching with hydrofluoric acid. This process was described without referring to the electric circuit for detecting changes in the capacitance of the variable capacitor which the vibrator 30 and the N+ layer 120 constitute, but it is possible to simultaneously produce such a circuit in the substrate 110 as will be understood from the description of the preceding embodiments.

The device of FIG. 14(G) can be produced without need of forming any epitaxially grown layer and therefore at low cost. As an advantage derived from the use of polycrystalline silicon as the material of the vibrator or movable electrode 30 of the cantilever beam form, there is no possibility of an unexpected change in the capacitance between the movable electrode 30 and the buried N+ layer 120 resulting from deformation of the movable electrode 30 by certain reasons such as a bimetallic effect produced by changes in the environmental temperature.

Figure 15:
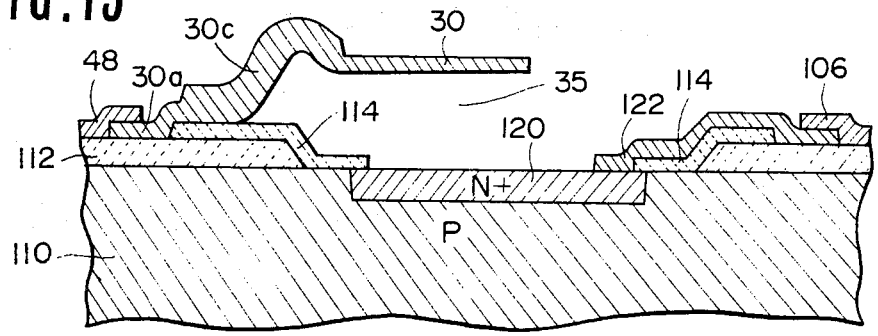
FIGS. 15 to 19 show eighth to twelfth embodiments of the invention in fragmentary and sectional views, respectively.

As the eighth embodiment, FIG. 15 shows a modification of the device of FIG. 14(G). In this device, the thickness of the vibrator 30 formed of polycrystalline silicon is made greater in its curved root portion 30c including and/or adjacent the base portion 30a adhering to the underlying film(s) than in the free end portion. The purpose of the increase in the thickness of the curved portion 30c is mechanical reinforcement of the vibrator 30. The vibrator 30 nonuniform in thickness can be formed, for example, in the following way. At the step of FIG. 14(D) in process of producing the device of FIG. 14(G), the polycrystalline silicon film to form the vibrator 30 is initially deposited to a relatively large thickness such as 2 μm, and, prior to the diffusion of P described hereinbefore with reference to FIG. 14(D), photoetching is carried out so as to reduce the thickness of the polycrystalline silicon film to 0.5-1 μm except the area to become the curved portion 30c of the vibrator 30.

The embodiment of FIG. 15 is favorable particularly when it is intended to make a vibrator 30 relatively low in resonance frequency and, hence, relatively great in length. In the manufacturing process of FIGS. 14(A) to 14(G), a small error in the inclination of the curved portion of the vibrator 30 possibly produced at the stage of removing the spacer 80 causes a considerable deviation of the relatively long free end portion of the vibrator 30 from horizontal or parallelism to the substrate surface. By reinforcing the curved portion 30c of the vibrator 30 in the manner as shown in FIG. 15, it is possible to greatly reduce the probability of such deformation of the vibrator 30 even when the vibrator 30 has a relatively great length. The modification shown in FIG. 15 is applicable also to the device of FIG. 2.

Figure 16:
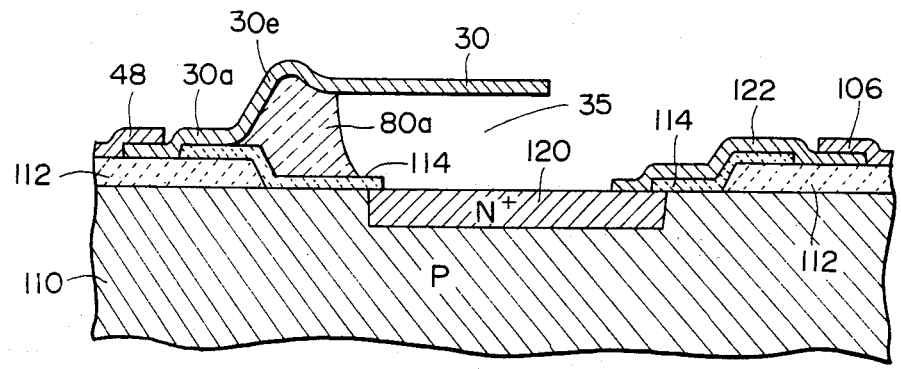

FIG. 16 shows another modification of the device of FIG. 14(G). In this case, the removal of the spacer 80 in the process of FIG. 14(A) to 14(G) is made incomplete so as to leave an end portion 80a of the spacer in a region beneath the curved portion 30c of the vibrator 30. This is an alternative to the increase of the thickness of the curved portion 30c of the vibrator 30 and has a similar effect.

Figure 17:
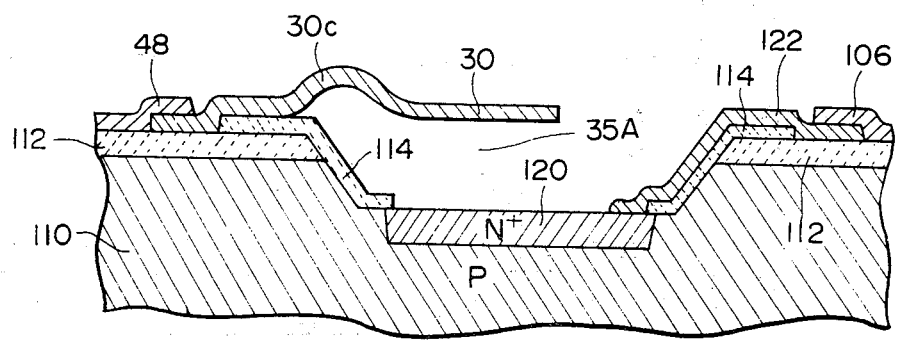

FIG. 17 shows a different modification of the device of FIG. 14(G). In this embodiment, the silicon substrate 110 is recessed in a region where the fixed electrode layer 120 is formed, and the major portion of the vibrator or movable electrode 30 extends on a horizontal plane very close to the substrate surface before the recessing. The substrate 110 is recessed so as to provide a sufficient gap 35A between the movable electrode 30 and the fixed electrode layer 120.

In the device of FIG. 17, the vibrator 30 including its curved root portion 30c does not greatly protrude upward from the level of the other films formed on the substrate surface. Accordingly the vibrator 30 becomes more resistant to a mechanical force acting generally in the direction parallel to the substrate (e.g. a force exerted thereon during etching of the spacer 80 or subsequent washing) and also to a mechancal force acting generally in the direction normal to the substrate (e.g. a force attributed to the contact of a mask with the substrate in patterning operations).

For example, the device of FIG. 17 can be produced by modifying the step of FIG. 14(A) in the process of producing the device of FIG. 14(G). That is, after the selective removal of the SiO2 layer 112 as shown in FIG. 14(A) the P-type silicon substrate 110 is etched from its exposed surface to a depth of 3–5 μm by using an anisotropic etching liquid such as a mixture of ethylenediamine, pyrocatechol and water.

Figure 18:
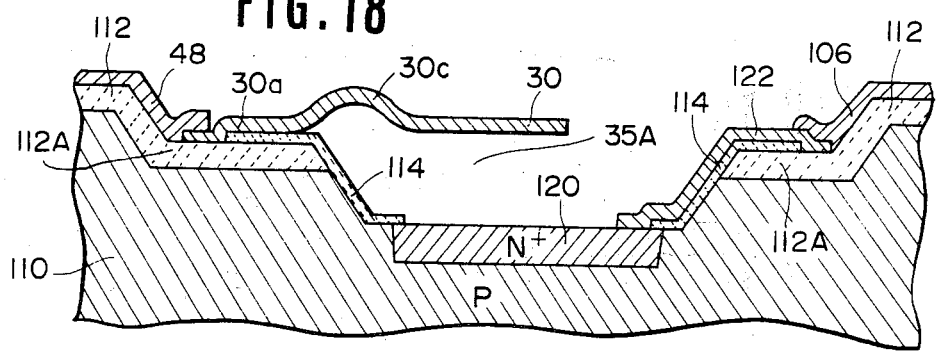

FIG. 18 shows a further modification of the device of FIG. 17. In this case the silicon substrate 110 is recessed at two stages. At the the first stage the substrate 110 is recessed over a relatively wide area in which the base portion 30a of the vibrator 30 and the electrode 122 for the fixed electrode layer 120 are also to be formed, and at the second stage the substrate 110 is further recessed in a central area of the initially recessed region so that the fixed electrode layer 120 may be formed in the deeply recessed area. Consequently, the vibrator 30 in the device of FIG. 18 scarcely protrudes from the initial surface of the substrate 110, so that the advantage described with respect to FIG. 17 is further augmented.

In producing the device of FIG. 18, the etching of the substrate 110 after selective removal of the SiO2 film 112 is performed in the manner as described above with respect to the device of FIG. 17 but over a wider area.

Then an oxide film 112A is formed over a marginal area of the recessed substrate surface, and the central area of the recess is further etched by using the oxide film 112A as a mask.

Figure 19:
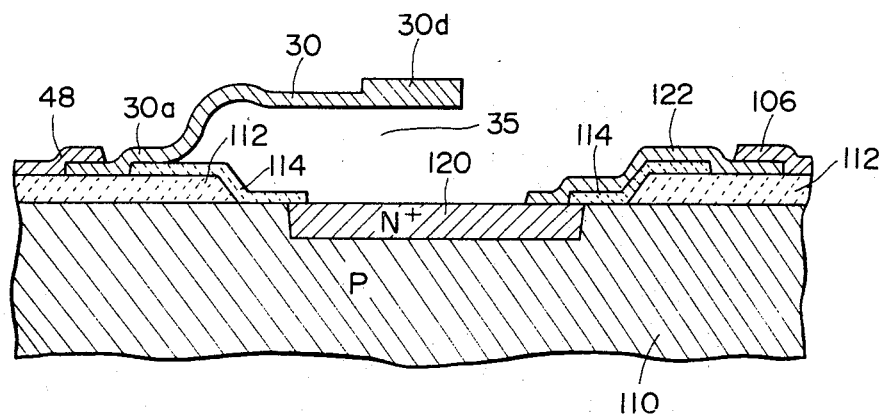

FIG. 19 shows a still further modification of the device of FIG. 14(G). In this device a free end portion 30d of the vibrator 30 formed of polycrystalline silicon has a greater thickness than the remaining portions so that the vibrator 30 has an increased mass in the free end portion 30d. Accordingly, the device of FIG. 19 can be regarded also as a modification of the device of FIG. 10 and has an advantage that the resonance frequency of the vibrator 30 can be rendered relatively low without need of extending the length of the vibrator 30.

Figure 20:
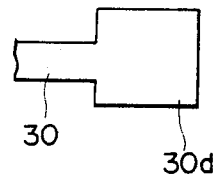
FIGS. 20 and 21 show two different modifications of a reed part in the device of FIG. 19 in fragmentary plan views, respectively.

Referring to FIG. 20, for the same purpose the vibrator 30 may be formed so to have an increased width in its free end portion 30d.

Figure 21:
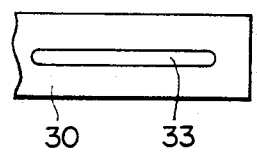

Referring to FIG. 21, it is advantageous to form the vibrator 30 in the device of FIG. 14(G) with a vertical through-hole 33 in the shape of a slit elongate along the longitudinal axis of the strip-like major portion of the vibrator 30. This slit 33 can be formed at the step of FIG. 14(D) where the polycrystalline silicon film is etched so as to leave the vibrator 30. At the subsequent step of removing the PSG spacer 80 by etching as described with reference to FIGS. 14(E) and 14(F), the etching proceeds from the PSG surface exposed by the slit 33 too, so that the etching time can be shortened.

The above described modifications can be made not only individually but also in various combinations.

Figure 22:
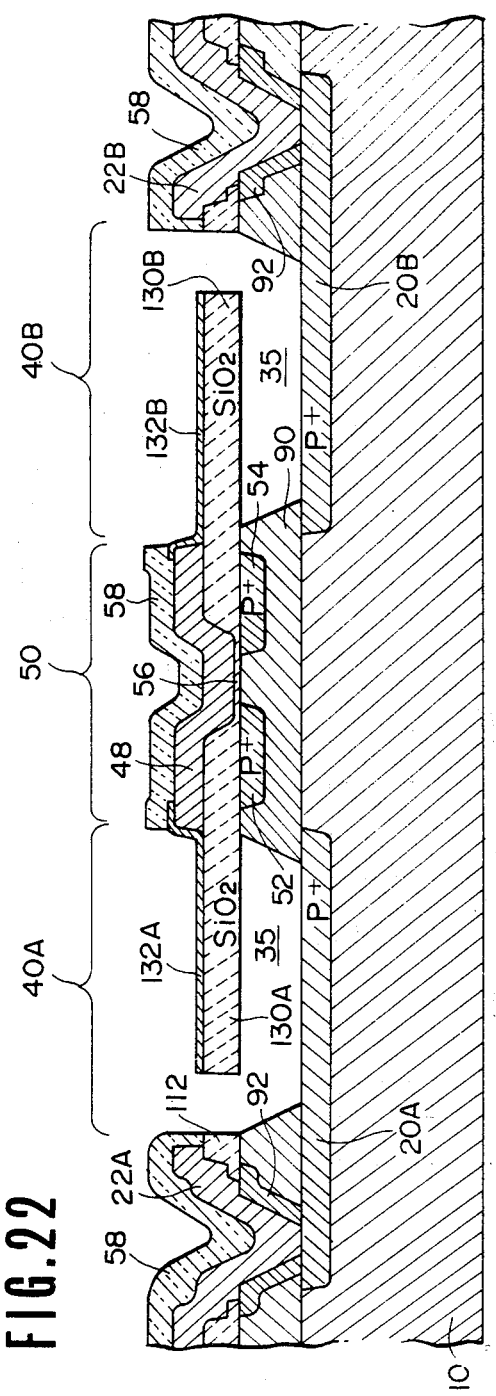
FIG. 22 is a fragmentary and schematic sectional view of a vibration analyzing device as a still different embodiment of the invention.

FIG. 22 shows a further embodiment of the invention. This device is fundamentally similar to the device of FIG. 6 and is characterized in that two vibrators 130A and 130B slightly different in resonance frequency are formed at a short distance therebetween and that an electric circuit is constructed so as to combinedly detect changes in the capacitances of the two capacitors formed respectively by using the two vibrators 130A and 130B as movable electrodes, so that the device can discriminate a very narrow range of vibration frequencies.

In the device of FIG. 22 the two vibrators 130A and 130B are formed of a nonconductive material such as silicon dioxide and respectively coated with electrode films 132A and 132B. The two vibrators 130A and 130B, both having a strip-like shape, are longitudinal axially in alignment and extend parallel to the N-type silicon substrate 10. In the substrate 10, there are two buried P+ layers 20A and 20B, one opposite to the first vibrator 130A and the other 20B opposite to the second vibrator 130B, and interconnection electrode layers 22A and 22B join to these P+ layers 20A and 20B, respectively. Therefore, the fixed P+ layer 20A and the movable electrode layer 132A on the first vibrator 130 provide a variable capacitor (indicated at 40A), and the fixed P+ layer 20B and the movable electrode layer 132B on the second vibrator 130B another variable capacitor (indicated at 40B). On the upper side of the substrate 10 an N-type epitaxial layer 90 is formed so as to bridge the two buried P+ layers 20A and 20B, and two diffused P+ layers 52 and 54 to respectively serve as the source and drain regions of a MOS transistor 50 are formed in this N-type layer 90. On the N-type layer 90 there is an oxide film 112 which is used to form the two vibrators 130A and 130B, and there is a gate oxide film 56 in the region between the two buried P+ layers 20A and 20B. An aluminum electrode layer 48 that extends over the gate oxide film 56 and the base portions of the two vibrators 130A and 130B serves as the gate electrode of the MOS transistor 50 and also as an interconnection electrode for the movable electrodes 132A and 132B. Thus, the two vibrators 130A and 130B are arranged generally symmetrical with respect to the MOS transistor 50. The upper surfaces of the device except the regions of the two variable capacitors are covered with a protective film 58 of a suitable material such as PSG.

Figure 23:
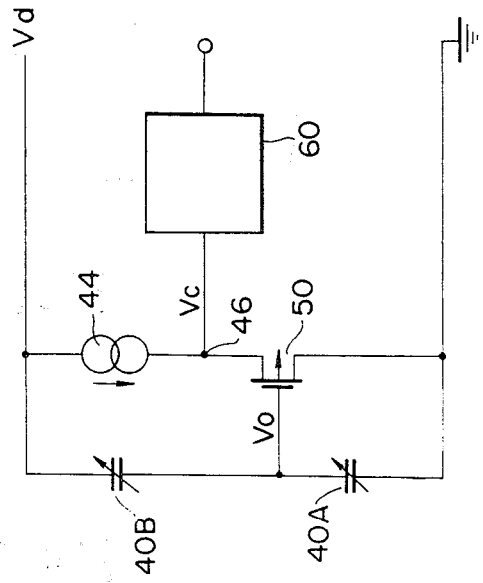
FIG. 23 is a diagram of an electric circuit equivalent to the device of FIG. 22.

As shown in the equivalent circuit of FIG. 23, the two variable capacitors 40A and 40B are connected in series between the DC power souce Vd and the grounds. A constant current source 44 and the MOS transistor 50 constitute a source-follower circuit, and a voltage $V_0$ appeared at the junction point between the two variable capacitors 40A and 40B is applied to the gate of the MOS transistor 50. A voltage $V_c$ which appears at the output terminal 46 of the source-follower circuit depends on the gate voltage $V_o$. The output voltage $V_c$ is put into an operational amplifier circuit 60.

There is a small difference between the resonance frequency $F_1$ of the first vibrator 130A and the resonance frequency $F_2$ of the second vibrator 130B. For example, it is assumed that $F_1 = 0.9 \times F_2$. A standard capacitance of the first variable capacitor 40A and the amount of a change in the capacitance will be represented by $C_1$ and $\Delta C_1$, respectively, and a standard capacitance of the second variable capacitor 40B and the amount of a change in the capacitance by $C_2$ and $\Delta C_2$, respectively.

Figure 24:
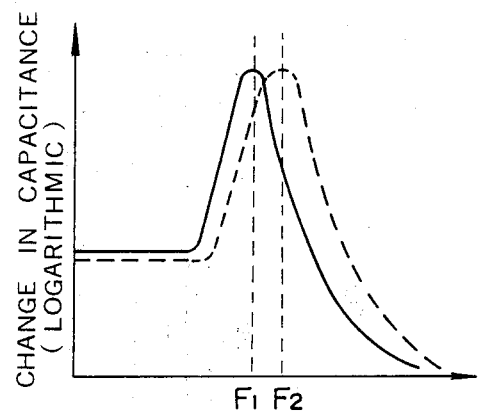
FIGS. 24 to 26 are graphs showing the functional characteristics of the device of FIG. 22.
Figure 25:
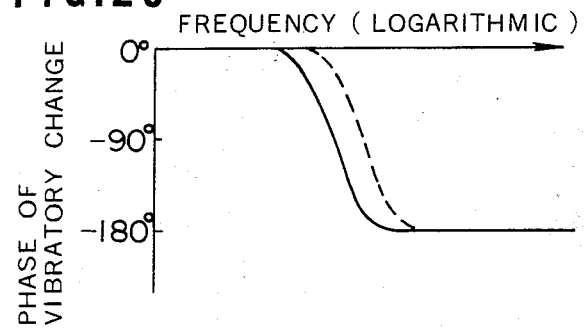

FIG. 24 shows the vibration characteristics of the two vibrators 130A and 130B. That is, the curve in solid line represents the relationship between the vibration frequency and the amount of change ($\Delta C_1$) in the capacitance $C_1$ of the first variable capacitor 40A, and the curve in broken line represents the same matter with respect to the second variable capacitor 40B. FIG. 25 shows the vibration phase characteristics of the first vibrator 130A (curve in solid line) and the second vibrator 130B (curve in broken line).

Where the two variable capacitors 40A and 40B have the same standard capacitance, i.e. $C_1 = C_2$, and $\Delta C_1$ and $\Delta C_2$ are sufficiently small relative to $C_1$ and $C_2$, respectively, the voltage $V_0$ produced by dividing the source voltage $V_d$ by the two capacitors 40A and 40B is given by the following equation.

$$V_0 = \{\tfrac{1}{2} + (\Delta C_2 - \Delta C_1)/4C_1\}V_d$$

Therefore, the AC component of the voltage $V_0$ becomes zero, and hence the AC component of the output voltage $V_c$ of the aforementioned source-follower circuit becomes zero, when $\Delta C_1 = \Delta C_2$.

Figure 26:
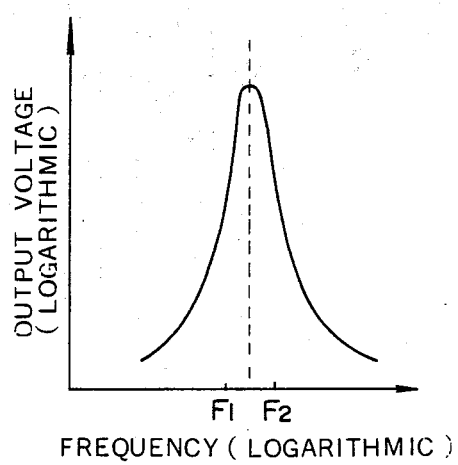

As can be seen in FIG. 25, at frequencies deviating from the resonance frequencies $F_1$ and $F_2$ the amounts of changes $\Delta C_1$ and $\Delta C_2$ in the capacitances of the respective capacitors 40A and 40B are in agreement in phase so that $\Delta C_1$ takes a value very close to the value of $\Delta C_2$ and, hence, the voltage $V_0$ becomes very small. However, in a narrow range of frequencies about the resonance frequencies $F_1$ and $F_2$, $\Delta C_1$ and $\Delta C_2$ are in inverted phases, meaning that $\Delta C_1$ takes a value close to $-\Delta C_2$, so that the voltage $V_0$ augments. Therefore, the frequency characteristic of the voltage $V_0$, or that of the corresponding output voltage $V_c$, becomes as shown in FIG. 26. That is, the output voltage $V_c$ exhibits a very sharp peak at a frequency in the middle of the resonance frequencies $F_1$ and $F_2$ of the two vibrators 130A and 130B and very rapidly attenuates on either side of that frequency, meaning that the output voltage has a resonance characteristic featuring a large Q value.

In the device of FIG. 22, each of the two vibrators 130A and 130B has a resonance characteristic represented by each curve in FIG. 24 and makes a significant response to external vibrations over a wide range of frequencies below the resonance frequency $F_1$ or $F_2$. However, the combination of the two vibrators 130A and 130B or two variable capacitors 40A and 40B provides an output characteristic represented by the curve in FIG. 26 and responds only to vibration frequencies within a very narrow range with high sensitivity when changes in the capacitances of the respective capacitors 40A, 40B are detected combinedly. Therefore, this device is very convenient for analytically detecting mechanical vibrations by dividing the vibrations into very narrow frequency ranges. Of course it is possible to construct a device of the type of FIG. 22 with the provision of a plurality of vibrator units each of which has two vibrators as shown in FIG. 22 and which are sensitive to respectively different frequencies. In other words, it is possible to produce an apparatus for spectrum analysis of mechanical vibrations as a single semiconductor device.

In the construction of the device of FIG. 22, it is favorable for enhancement of the vibration detecting sensitivity that the two movable electrodes 132A and 132B are directly connected with the gate of the MOS transistor 50. In other words, it is unfavorable to employ an alternative construction wherein the two buried P+ layers 20A and 20B are connected with the gate of the MOS transistor 50 because in that case the input impedance of the MOS transistor 50 becomes low due to a capacitance of a depletion layer produced between the P+ layers 20A, 20B and the N-type substrate 10.

Figure 27:
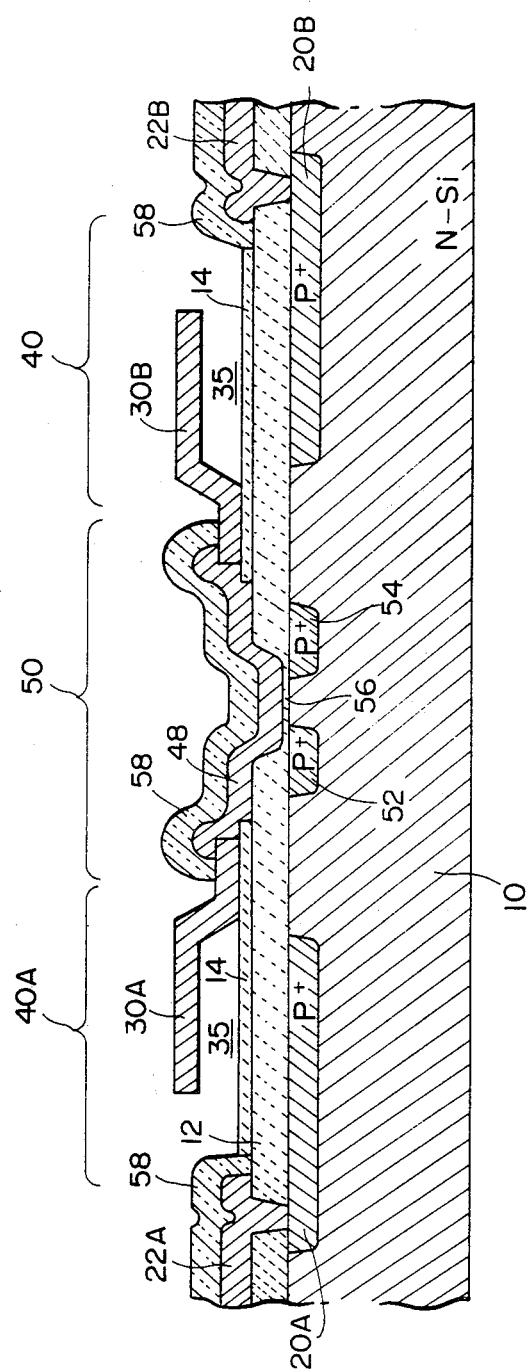
FIG. 27 is a fragmentary and schematic sectional view of a vibration analyzing device as a still different embodiment of the invention.

FIG. 27 shows a device obtained by applying the above described principle of the device of FIG. 22 to the device of FIG. 2. That is, each vibrator unit in this device has two vibrators 30A and 30B which are connected with the gate of the MOS transistor 50 and arranged generally symmetrical with respect to the MOS transistor 50, and each vibrator 130A, 130B is formed of polycrystalline silicon to serve as a movable electrode in itself. The two vibrators 30A and 30B are slightly different in resonance frequency. The vibrator or movable electrode 30A and a diffused P+ layer or fixed electrode layer 20A in the substrate 10 provides a variable capacitor 40A, and the other movable electrode 30B and another diffused P+ layer or fixed electrode layer 20B another variable capacitor 40B. The electric circuit shown in FIG. 23 is constructed in the device of FIG. 27. Therefore, the vibration analyzing device of FIG. 27 is similar in the response or output characteristic to the device of FIG. 22.

What is claimed is:

1. A vibration analyzing device comprising:
    a semiconductor substrate;
    a vibrator having a vibratable portion, which is generally in the form of a thin plate and comprises a unitary electrode layer, and at least one base portion which is contiguous to said vibratable portion and fixed to said substrate such that said vibratable portion is spaced from said substrate and extends generally parallel to said substrate;
    a fixed electrode layer formed in a surface region of said substrate so as to lie opposite to said vibratable portion of said vibrator such that said electrode layer of said vibrator and said fixed electrode layer provide a variable capacitor; and an electric circuit means integrated with said substrate for detecting a change in the capacitance of said variable capacitor.

2. A device according to claim 1, wherein said vibrator is formed of a conductive material so that the entirety of said vibratable portion serves as said unitary electrode layer.

3. A device according to claim 2, wherein said conductive material is silicon.

4. A device according to claim 2, wherein said conductive material is a metal resistant to corrosion.

5. A device according to claim 1, wherein said vibrator is fundamentally formed of an insulating material and said vibratable portion is at least partially coated with a conductive film which serves as said unitary electrode layer.

6. A device according to claim 5, wherein said insulating material is an oxide of a semiconductive element.

7. A device according to claim 1, wherein said vibrator is mounted on said substrate in the manner of a cantilever beam so that said vibratable portion has a free end portion.

8. A device according to claim 7, wherein said vibrator comprises a weight which is fixed to said free end portion to adjust the resonance frequency of the vibrator.

9. A device according to claim 7, wherein said free end portion of said vibrator has a greater thickness than the remaining portion of said vibratable portion.

10. A device according to claim 7, wherein said free end portion of said vibrator has a greater width than the remaining portion of said vibratable portion.

11. A device according to claim 7, wherein said base portion of said vibrator has a curved border portion which rises from said substrate to join with said vibratable portion and has a greater thickness than said vibratable portion.

12. A device according to claim 11, wherein said vibrator comprises a weight which is fixed to a middle portion of said vibratable portion to adjust the resonance frequency of the vibrator.

13. A device according to claim 7, wherein said base portion of said vibrator has a curved border portion which rises from said substrate to join with said vibratable portion, the device further comprising a support layer which occupies a space between said substrate and said border portion.

14. A device according to claim 1, wherein said vibrator is mounted on said substrate in the manner of a fixed beam so that said vibratable portion is an intermediate portion between two base portions where the vibrator is fixed to said substrate.

15. A device according to claim 1, wherein said substrate is recessed in an area containing said fixed electrode layer such that the outer surface of said fixed electrode layer is below the level of the substrate surface in other areas.

16. A device according to claim 15, wherein said substrate is recessed in another area surrounding said area to less depth than in said area, said base portion of said vibrator being fixed to said substrate in said another area.

17. A device according to claim 1, further comprising at least one combination of an additional vibrator which is generally similar to said vibrator but different in resonance frequency from said vibrator, an additional fixed electrode layer which is generally similar to said fixed electrode layer but arranged opposite to said additional vibrator and an additional electric circuit means which is generally similar to said electric circuit means but arranged so as to detect a change in the capacitance of a capacitor provided by the unitary electrode layer of said additional vibrator and said additional fixed electrode layer.

18. A device according to claim 17, wherein said additional vibrator is different from said vibrator in the length of said vibratable portion.

19. A device according to claim 17, wherein said additional vibrator is substantially identical with said vibrator in the length of said vibratable portion and comprises a weight which is fixed to said vibratable portion to adjust the resonance frequency of said additional vibrator.

20. A device according to claim 1, wherein said vibrator is formed by first depositing a film on said substrate by using a thin-film technique such that a portion of said film is deposited on a support layer precedently formed on said substrate and subsequently removing said support layer by etching.

21. A device according to claim 20, wherein said vibrator is formed with a slit in said vibratable portion.

22. A device according to claim 1, wherein said electric circuit means comprises a fixed capacitor, which is connected in series with said variable capacitor such that a source voltage is divided by said fixed capacitor and said variable capacitor, and a MOS transistor of which the gate is connected to a junction point between said fixed capacitor and said variable capacitor.

23. A device according to claim 22, further comprising at least one combination of an additional vibrator which is generally similar to said vibrator but different in resonance frequency from said vibrator, an additional fixed electrode layer which is generally similar to said fixed electrode layer but arranged opposite to said additional vibrator; and an additional electric circuit means comprising an additional fixed capacitor, which is connected in series with an additional variable capacitor provided by the unitary electrode layer of said additional vibrator and said additional fixed electrode layer such that a source voltage is divided by said additional fixed capacitor and said additional variable capacitor, and a MOS transistor of which the gate is connected to a junction point between said additional fixed capacitor and said additional variable capacitor.

24. A device according to claim 1, further comprising an additional vibrator which is located close to said vibrator and generally similar to said vibrator but is slightly different in resonance frequency from said vibrator and an additional fixed electrode layer which is generally similar to said fixed electrode layer but arranged opposite to the unitary electrode layer of said additional vibrator such that the unitary electrode layer of said additional vibrator and said additional fixed electrode layer provide an additional variable capacitor, said electric circuit means being so constructed as to detect a change in the capacitance of said variable capacitor and a change in the capacitance of said additional variable capacitor combinedly, whereby the two vibrators, the two fixed electrode layers and said electric circuit means constitute a vibration detector unit which is sharply responsive specifically to vibration frequencies in a narrow range with a mean value of the resonance frequency of said vibrator and the resonance frequency of said additional vibrator as the middle of the range.

25. A device according to claim 24, wherein said electric circuit means comprises a MOS transistor of which the gate is connected with a junction point between said variable capacitor and said additional variable capacitor which are connected in series with each other such that a source voltage is divided by said variable capacitor and said additional variable capacitor.

26. A device according to claim 25, wherein the gate of said MOS transistor and the unitary electrode layers of said vibrator and said additional vibrator are directly connected with one another by a common interconnection electrode.

27. A device according to claim 25, wherein each of said vibrator and said additional vibrator is mounted on said substrate in the manner of a cantilever beam so that said vibrational portion of each vibrator has a free end, said vibrator and said additional vibrator being substantially contiguous to each other in the base portions thereof and extending in reverse directions in the vibratable portions thereof.

28. A device according to claim 24, further comprising at least one additional vibration detector unit which is generally similar in construction to said vibration detector unit but is different from said vibration detector unit in the middle frequency of the narrow range of vibration frequencies.

* * * * *